United States Patent [19]

Hatzakis et al.

[11] Patent Number: 4,581,100
[45] Date of Patent: Apr. 8, 1986

[54] MIXED EXCITATION PLASMA ETCHING SYSTEM

[75] Inventors: Michael Hatzakis, Chappaqua; Juri R. Paraszczak, Pleasantville; Bennett Robinson, New York, both of N.Y.

[73] Assignee: International Business Machines Corporation, Armonk, N.Y.

[21] Appl. No.: 665,696

[22] Filed: Oct. 29, 1984

[51] Int. Cl.$^4$ .................... B44C 1/22; C03C 15/00; C03C 25/06
[52] U.S. Cl. .................... 156/643; 156/345; 156/646; 204/192 E; 204/298
[58] Field of Search .................... 156/345, 643, 646; 204/164, 192 E, 192 EC, 298; 427/38, 39; 118/728, 50.1, 620; 134/1; 219/121 PD, 121 PE, 121 PF, 121 PG

[56] References Cited

U.S. PATENT DOCUMENTS

| 4,298,419 | 11/1981 | Suzuki et al. | 156/345 |
| 4,316,791 | 2/1982 | Taillet | 156/345 X |
| 4,384,933 | 5/1983 | Takasaki | 204/298 X |

Primary Examiner—William A. Powell
Attorney, Agent, or Firm—Ronald L. Drumheller

[57] ABSTRACT

It has been discovered surprisingly that when a plasma is produced by exciting a gas or mixture of gases with microwaves and simultaneously also with a radio frequency electrical discharge, that the resulting plasma is much more highly chemically reactive than a plasma produced instead by only one of the excitations. Such a plasma etches a surface much faster than the sum of the etch rates produced by each of the excitations individually and the etching anisotropy may be controlled by varying the ratio of the applied power of each of the two kinds of simultaneous excitation.

10 Claims, 2 Drawing Figures

MIXED EXCITATION PLASMA ETCHING SYSTEM

DESCRIPTION

1. Technical Field

This invention relates to dry chemical etching systems and methods for use in fabricating integrated circuits and the like and more particularly it relates to a plasma etching system and method having both microwave and radio frequency (RF) excitation.

2. Background Art

Microwave plasma reactors are used in the semiconductor industry to perform both deposition and etching steps. With this method, a suitable gas or combination of gases is excited with microwave energy to form a plasma containing chemically reactive species such as ions, electrons and radicals. The microwave plasma is slowly flowed against the surface being treated, where the reactive species cause chemical reactions to occur which result in either material deposition or material removal (etching).

Radio frequency plasma reactors are also used in the semiconductor industry for both etching and deposition. With this method, a suitable gas or combination of gases is excited by a high frequency electrical discharge rather than by microwave energy. With RF excitation, a plasma is also produced which contains ions, electrons and radicals. The ions, electrons and radicals in the RF excited plasma are much less chemically excited than in the microwave plasma. However, unlike with a microwave excited plasma, ion bombardment of the surface being treated occurs with an RF excited plasma due to the electric potential of the plasma relative to the surface being treated. As a result of the ion bombardment effect, RF excited plasmas tend to etch anisotropically while microwave excited plasmas tend to etch isotropically.

Etching systems have also been described in the prior art which use both a microwave plasma and an RF plasma. Examples of such systems may be found, for example, in U.S. Pat. Nos. 4,316,791, 4,384,933 and 4,282,267. These systems seek to obtain the advantages of both types of plasma etching effects by using a microwave plasma to form highly excited reactive species and an RF plasma to bombard the surface to be etched with the microwave plasma excited reactive species. These systems all actively or passively move the microwave excited reactive species from a region excited by microwaves to an adjoining region excited by an RF electrical discharge. Heretofore, the spatial region excited by microwaves and the spatial region exited by the RF discharge have remained separate though closely connected.

It is the object of this invention to superpose microwave and RF excitation of a gas or gas mixture to produce a plasma having superior etching characteristics.

DISCLOSURE OF THE INVENTION

It has been discovered surprisingly that when a plasma is produced by exciting a gas or mixture of gases with microwaves and simultaneously also with a radio frequency electrical discharge, that the resulting plasma is much more highly chemically reactive than a plasma produced instead by only one of the excitations. Such a plasma etches a surface much faster than the sum of the etch rates produced by each of the excitations individually and the etching anisotropy may be controlled by varying the ratio of the applied power of each of the two kinds of simultaneous excitation.

DESCRIPTION OF THE PREFERRED EMBODIMENT

Figure 1:
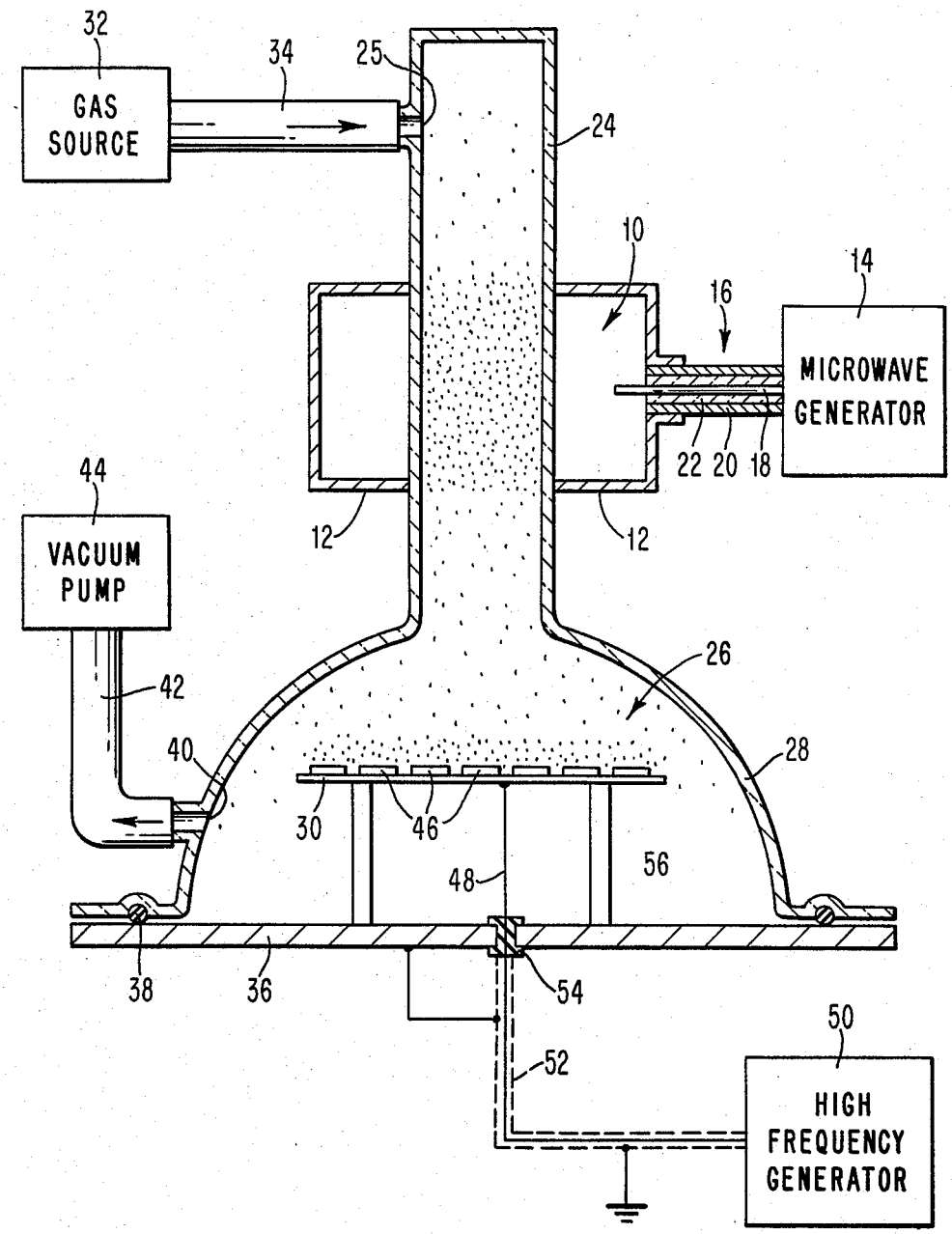
FIG. 1 illustrates partly in cross-section and partly schematically a mixed excitation plasma etching apparatus in accordance with this invention.

Referring now to FIG. 1, a microwave cavity 10 defined by metallic walls 12 receives microwave power from microwave generator 14 via a conventional microwave waveguide 16 comprising a central electrical conductor 18 spaced from a concentric conductive tube 20 by dielectric material 22. Passing through microwave cavity 10 is a gas confining tube 24 closed at one end except for a gas inlet opening 25 and connected at the other end to a reaction chamber 26. The walls 28 of reaction chamber 26 and tube 24 are composed of a material which is permeable to the microwave frequency at which generator 14 is driving cavity 10. Furthermore, the size of the hole through which tube 24 exits cavity 10 is sufficiently large and the distance between the cavity 10 and chamber 26 sufficiently small that microwaves will leak out of cavity 10 and propagate downward to significantly stimulate with microwaves not only the region within tube 24 which is within cavity 10 but also the region within tube 24 below cavity 10 and the region of chamber 26 between electrode 30 and cavity 10. Since the walls 28 of reaction chamber 26 and tube 24 will contain a plasma, the material selected for the tube 24 and walls 28 also must be able to tolerate the expected high temperature. A suitable material for the walls 28 and tube 24 is quartz, for example.

A suitable gas or a mixture of gases from source 32 enters tube 24 via gas hose or tubing 34 at the end of tube 24 remote from the reaction chamber 26 and flows down tube 24 and into chamber 26. Chamber 26 comprises upper walls 28 and a support base 36 sealed to walls 28 via O-ring 38. Chamber 26 also contains a gas exit opening 40 connected via a tube or hose 42 to a vacuum pump 44. Vacuum pump 44 in cooperation with gas source 32 establish a gas flow which travels down tube 24 and strikes electrode 30 much as if electrode 30 were a gas flow baffle. The workpiece or workpieces sought to be etched are placed on top of electrode 30 with the material side or surface to be etched facing upward towards the gas flow from tube 24. In FIG. 1, the workpieces sought to be etched are silicon wafers 46.

Electrode 30 is connected via a conductor 48 to a high frequency generator 50. Conductor 48 has shielding 52 electrically connected to base 36, which is also conductive. A grommet or plug 54 insulates conductor 48 from electrical contact with base 36. Electrode 30 is both supported from base 36 and electrically insulated therefrom by legs 56.

In operation a gas suitable for forming the desired plasma flows into tube 24 from gas source 32. Suitable gases, for example, include many of the halogens, halocarbons, rare gases, and the like, including for example:

$O_2$, $N_2$, $H_2$, $CF_4$, $Cl_2$, $SF_6$, etc. Typically the gas pressure is moderately low, such as 100 mTorr. As the gas enters cavity 10 it becomes excited and forms a microwave plasma. This is schematically depicted in FIG. 1 by the stippling. As indicated, the plasma also extends within tube 24 to some extent upward beyond the microwave cavity 10 due to diffusion of gaseous constituents and leakage of the microwaves upward through the top hole in the microwave cavity. The microwave plasma also extends downward into chamber 26 and covers electrode 30 and anything on electrode 30. As described earlier, microwave stimulation of the plasma extends all the way down to electrode 30. As will become apparent from an experiment to be described below, since the microwave plasma directly contacts the workpieces 46, etching of the workpieces will occur (assuming the surface of the workpieces are capable of being etched by the type of microwave plasma formed) even without any RF excitation of electrode 30, though at a much slower rate and in an isotropic fashion.

In accordance with this invention, however, radio frequency (RF) electrical power is simultaneously applied to electrode 30. As will become apparent from the experiment described below, in the absence of any microwave stimulation of the gas, the RF power supplied to electrode 30 alone would create a plasma. Such an RF excited plasma is often called an RIE (reactive ion etching) plasma.

Figure 2:
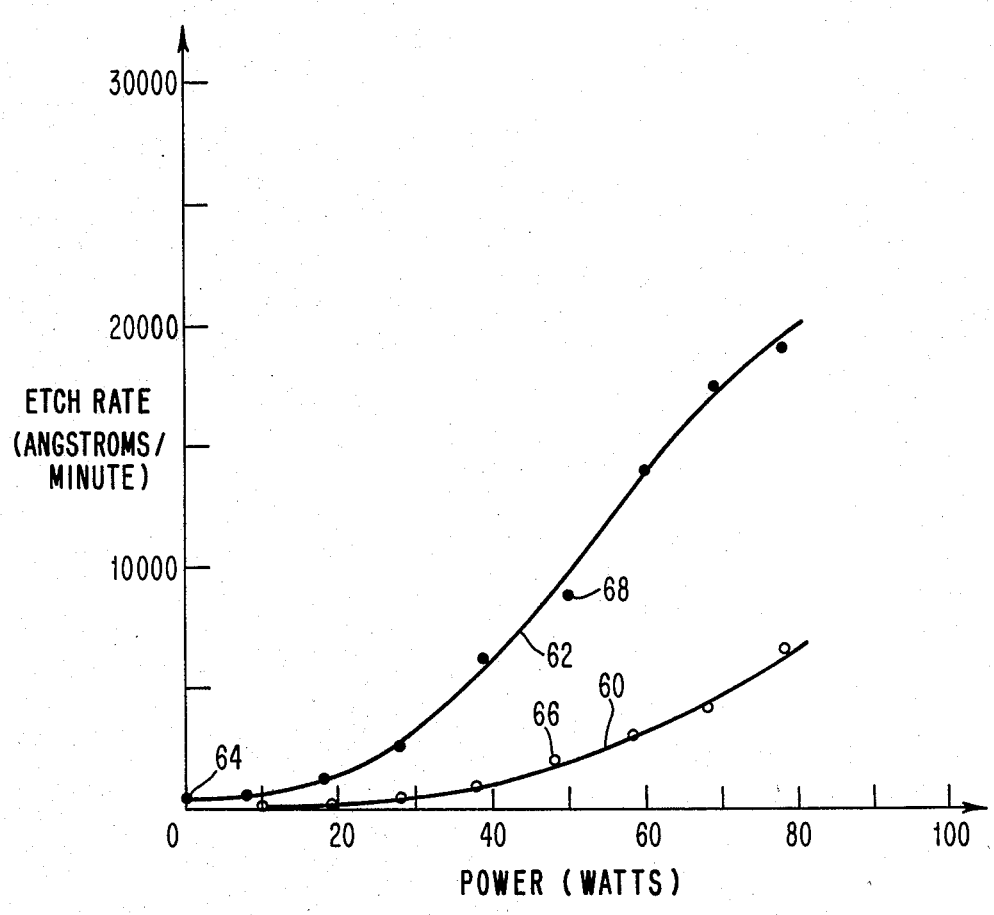
FIG. 2 is a graph showing the improvement in etching rate obtained in an experiment when radio frequency excitation was simultaneously added to a microwave excited plasma.

FIG. 2 graphically illustrates some experimental results obtained with the apparatus shown in FIG. 1. The experiment was conducted using a 6.25 cm. graphite wafer as a workpiece substrate upon which a conventional resist was deposited (Shipley AZ 1350J resist). The rate at which the resist was etched by an oxygen plasma was then measured under various conditions. The measured etch rate is plotted in FIG. 2 against the power supplied by the microwave source at 2.54 GHz. Curve 60 connects the experimental data points obtained when the high frequency generator 50 was supplying no power at all to the plasma (generator 50 was turned off). Curve 62 connects the experimental data points obtained when the high frequency generator was supplying 5 watts of power to the plasma at 13.56 MHz. When the RF source 50 alone was used to form the plasma (data point 64) the etch rate was 100 Angstroms per minute at 5 watts of applied RF power. When the microwave source 14 alone was used to form the plasma (data point 66) the etch rate was 2000 Angstroms per minute at 50 watts of applied microwave power. When the plasma was excited simultaneously with 5 watts of RF power and 50 watts of microwave power (data point 68), the etch rate was 8000 Angstroms per minute, about 4 times the linear sum of the two individual etch rates. The side wall profile of the etched resist was vertical (perpendicular to the electrode) when the plasma was stimulated by only RF power and severely undercut (the bottom of etched grooves were wider than the top) when the plasma was stimulated entirely by microwaves. When both microwaves and RF power were used to stimulate the plasma, the side wall profile was intermediate between the two (i.e. slightly undercut).

It should be apparent from this experiment that a combined stimulation of the plasma by both RF energy and microwave energy causes a synergistic effect (i.e., the total effect is much greater than the sum of the constituent effects). Furthermore, the degree of undercut resulting from microwave plasma etching can be reduced and controlled by adding RF stimulation to the plasma.

Having thus described our invention, what we claim as new, and desire to secure by Letters Patent is:

1. Apparatus for etching a material surface with a plasma, comprising:
   a reaction chamber having an internal electrode for supporting the material to be etched;
   means for flowing a gas against the material surface to be etched:
   means for exciting said flowing gas with microwave energy to form a flowing microwave plasma, said flowing microwave plasma being continuously excited by microwave energy as it flows against said material surface to be etched; and
   a high frequency power source connected to said electrode for simultaneously exciting said microwave plasma flowing against said material surface to be etched with a radio frequency electric field, said radio frequency excitation enhancing the etching rate of said microwave plasma and making the etching effect of said microwave plasma more anisotropic.

2. Apparatus as defined in claim 1 wherein said means for flowing a gas against the material surface to be etched comprises;
   a source of gas capable of being excited by microwave energy and by radio frequency energy; and
   a microwave permeable tube for conveying gas from said gas source to said reaction chamber.

3. Apparatus as defined in claim 3 wherein said means for exciting said flowing gas comprises;
   an excited microwave cavity through which said microwave permeable tube passes, a microwave plasma being formed within said cavity in said tube, said microwave plasma flowing within said tube from said cavity to said reaction chamber and against the material surface to be etched.

4. Apparatus as defined in claim 3 wherein microwaves leak from said cavity and travel along said tube to the material surface to be etched in said reaction chamber.

5. Apparatus as defined in claim 4 wherein the walls of said reaction chamber facing the material surface to be etched are microwave permeable.

6. Apparatus as defined in claim 5 wherein said microwave permeable tube and said microwave permeable walls are composed of quartz.

7. Apparatus as defined in claim 2 wherein said means for flowing a gas further comprises a vacuum pump connected to said reaction chamber.

8. Apparatus as defined in claim 2 wherein said gas is a halogen or halocarbon or rare gas.

9. Apparatus as defined in claim 8 wherein said gas comprises a gas selected from the group consisting of $O_2$, $N_2$, $H_2$, $CF_4$, $Cl_2$ and $SF_6$.

10. A method for etching a material surface with a plasma, comprising the steps of:
    forming a microwave plasma;
    flowing the microwave plasma against the material surface to be etched, the microwave plasma being continuously excited with microwave energy while it flows against said surface to be etched; and
    simultaneously exciting said microwave plasma flowing against said surface to be etched with a radio frequency electric field, said radio frequency excitation enhancing the etching rate of said microwave plasma and making the etching effect of said microwave plasma more anisotropic.

* * * * *